(12) United States Patent
Condra et al.

(10) Patent No.: US 6,309,517 B1
(45) Date of Patent: Oct. 30, 2001

(54) APPARATUS FOR INLINE PLATING

(75) Inventors: Richard Carroll Condra, Fredericksburg; Richard Malcolm Johnson, Bedford, both of TX (US)

(73) Assignee: Oliver Sales Company, Dallas, TX (US)

( * ) Notice: Subject to any disclaimer, the term of this patent is extended or adjusted under 35 U.S.C. 154(b) by 0 days.

(21) Appl. No.: 09/535,657

(22) Filed: Mar. 21, 2000

Related U.S. Application Data (63) Continuation-in-part of application No. 09/199,597, filed on Nov. 25, 1998, now Pat. No. 6,153,064.

(51) Int. Cl.[7] .................................................. C25D 17/00
(52) U.S. Cl. ................... 204/198; 204/225; 204/297.06; 204/279
(58) Field of Search ..................................... 204/198, 199, 204/200, 201, 224 R, 225, 226, 297.06, 279

(56) References Cited

U.S. PATENT DOCUMENTS 4,459,183 * 7/1984 Brady et al. ........................... 205/145
4,800,001 * 1/1989 Ott et al. ............................... 205/125

* cited by examiner

Primary Examiner—Donald R. Valentine
Assistant Examiner—Wesley A. Nicolas
(74) Attorney, Agent, or Firm—Larry B. Dwight (57) ABSTRACT

This invention comprises a driven conveyor for transporting work pieces into one or more flood plating cells for electroplating a metal onto the planar surfaces and surfaces of the through holes of the work piece. An electrolyte solution is pumped by one or more recirculating pumps into the flood cell at such a rate as to maintain the liquid at a desired level covering the anodes and work pieces while work pieces are moved through the cells. One or more power sources provide direct current to the anodes and to the electrified contactors to transmit electrical current to the work pieces. The electrified contactors are positioned across the path of the work piece and spaced outside of the flood cell such that the electrolyte solution does not contact the contactors. Plating will occur so long as the work piece is in contact with one or more of the electrified contactors and the electrolyte.

3 Claims, 5 Drawing Sheets

APPARATUS FOR INLINE PLATING

CROSS REFERENCE TO RELATED APPLICATIONS

This application is a continuation in part of application Ser. No. 09/199,597 filed on Nov. 25, 1998, now U.S. Pat. No. 6,153,064, entitled, Apparatus for In Line Plating.

BACKGROUND OF INVENTION

This invention is a unique arrangement of a plating device for electroplating work pieces with metallic deposits. It is often desirable to process the work pieces using conveyorized equipment. When the work pieces are flat sheets or plates with through holes, such as printed circuit boards, they are often processed through operations in which solutions are forced through the holes. Examples of this include: drilling smear removal, drilling burr residue removal, applying materials to hole walls to make nonconductive hole walls conductive, stripping of metallic deposits from hole walls, and development of coatings out of holes.

The most commonly used conveyorized equipment for such applications has a horizontal roller conveyor on which the work pieces are placed. The work pieces are carried horizontally through processing chambers where solutions are pumped or sprayed onto the surfaces and into the through holes. Other less common processing equipment has a conveyor with vertical rollers. The vertical rollers are usually accompanied by horizontal guide wires or rails to keep the work pieces vertical while being transported through the processing chambers. Inside the processing chambers, solutions are pumped or sprayed onto the surfaces and into the through holes.

Up to this time, it has been common practice to process work pieces through several operations using conveyorized equipment to prepare them for plating of metallic deposits onto essentially the entire planar surface and the surfaces of the through holes. Even though conveyorized equipment is used for many manufacturing steps prior to electroplating, in order to perform the actual plating operation, the work pieces are usually removed from the conveyorized equipment, attached to electrically conductive racks, and electroplated in dip tanks. Even when conventional automated plating machines are used to transport the work pieces through the plating tanks for the electroplating operation, it is still necessary to unload work pieces from the conveyorized equipment and manually place them onto the rack of the automated plating machine. It is desirable to plate the work pieces as they are transported through the conveyorized equipment. Such in line plating, without removing the work pieces from the conveyorized equipment, would reduce processing time and labor.

Automatic plating machines originally designed for decorative or engineering electroplating which transport parts through dip tanks on carousels or programmed hoists have been used to successfully plate flat work pieces with through holes. However, this type of plating equipment is not well suited to other manufacturing operations where solutions must be sprayed or pumped through the holes in the work pieces. This is especially true when the diameter of the holes is small in relation to the thickness of the panels. For these non-plating operations, the work pieces are usually processed in conventional horizontal conveyorized equipment or vertical conveyorized equipment described above.

Automatic plating machines originally designed to electroplate wire or continuous strips of metal, such as reel to reel plating of electronic component lead frames, are not suitable for use with discreet flat work pieces such as printed circuit boards. Because wire and strips are continuous, they are easily electrified by applying an electric potential difference between convenient points along the work piece. However, flat panels are discreet work pieces rather than continuous strips. The electrification of discreet work pieces is not possible using wire or reel to reel plating machines.

Several conveyorized plating machines for printed circuits boards and other similar work pieces have been developed. Most such conveyorized machines are designed for plating a limited part of the planar surface of the work piece, such as contact tabs. The area on which the plated deposit is applied is usually limited to one or more edges of the panel. Examples of this type of machine are disclosed in U.S. Pat. No. 4,035,245, 4,186,062, and 4,377,461. Whereas these types of machines are well suited for plating the margins of flat work pieces, they are not suitable for plating the entire planar surfaces and the surface of through holes.

Several other plating machines designed to simultaneously plate essentially the entire planar surfaces and the surfaces of through holes of flat work pieces have been proposed. Examples of these include those disclosed in U.S. Pat. No. 4,385,967, 4,401,522, 4,755,271, 5,417,828, and 5,658,441. Whereas machines of these types can successfully plate essentially the entire planar surfaces and the surfaces of through holes of the work pieces, all of these machines have one or more specific problems as will be more fully explained hereinafter.

The apparatus disclosed in U.S. Pat. No. 4,385,967 issued to Brady et al transports the work pieces placed horizontally on a conveyor having horizontal rollers. Using this type of machine, work pieces may be processed through normal nonelectrified operations using conventional horizontal processing equipment mated to the plating apparatus. When work pieces reach the point in the manufacturing operations at which electroplating is required, one edge of each panel engages a series of electrified, driven contact wheels. The contact wheels transport the work pieces through the plating chamber and provide electrical connection to the work pieces. One or more of the electrified contact wheels is in electrical contact with the work piece during the entire time the work piece is in the plating chamber. Whereas this apparatus does allow the continuous processing of work pieces through conventional horizontal conveyorized equipment and through the disclosed apparatus without unloading and reloading, the contact wheels receive undesired electroplated deposits. Although the contact wheels are shielded from the electrolyte solution, they still accumulate electroplated deposit. These accumulated electroplated deposits interfere with electrical contact with the work pieces. When such buildup of electrodeposited metal occurs, the deposit must be removed from the contact wheels. Because of the location of the contact wheels, and because of the design of the wheel driving mechanism, removal of the contact wheels for cleaning is difficult and entails substantial time and labor. Additionally, the work pieces must be carefully positioned so that one edge of each panel is aligned properly to engage with the contact wheels. This need for alignment necessitates use of a repositioning mechanism immediately before the work pieces enter the contact wheel area. Otherwise, work pieces not repositioned immediately before entering the plating zone may not properly engage the electrified contact wheels. Furthermore, the supporting device that carries the edge of the work pieces opposite the contact wheels must be adjusted for each different width panel. All panels processed must have a common width or the machine must be taken out of service while the support device is adjusted for a new panel width. This limitation prevents continuous processing of mixtures of work pieces of significantly different widths. Taking the machine out of service for width adjustments dramatically limits it usefulness for many factories that process work pieces of differing widths. In addition, the contact wheels are offset outside the zone where the electrolyte makes continuous contact with the work pieces. This offset is required to allow space for the shielding to protect the contact wheels from making electrical contact with large volumes of the electrolyte. Such shielding is necessary to minimize electrodeposition of metal onto the contact wheels. However, as disclosed by Brady, the portion of the work piece which contacts the contact wheels, that lies between the contact wheels and the zone where the electrolyte washes over the work piece will not be plated. Thus, the work pieces may have no through holes that require plating in this unusually wide area. This results in wasted materials and added expense. Finally, this apparatus is extremely complex. With so many moving parts that require careful alignment, the maintenance of this apparatus can reasonably be expected to demand substantial time and labor.

The apparatus disclosed in U.S. Pat. No. 4,401,522 issued to Buschow et al is designed to plate essentially the entire surface and through holes of flat work pieces, such as printed circuit boards, while they are transported through the plating zone by a conveyor located about the plating tank. Work pieces are suspended vertically from the conveyor by electrically conductive carriers. Electrical contact with the work pieces is made by electrically conductive clamps attached to the carriers grasping one edge of each work piece. The electrically conductive carriers are attached to the conveyor. The carriers make electrical contact with electrified strips outside the process chambers at appropriate locations. The work pieces are thereby electrified while they are transported through the electroplating process chambers. Work pieces suspended vertically from such a conveyor tend to swing in an arc perpendicular to the direction of travel of the conveyor. If the work pieces swing excessively, the panels may strike the walls of the chambers and/or the vertical spargers inside the process chamber causing the conveyor to jam. If the swinging becomes excessive in the plating zone, the work pieces could strike the metallic anode baskets, creating an electrical short. In addition, this apparatus is not compatible with conventional horizontal conveyorized processing equipment. Work pieces processed on such horizontal equipment must be unloaded and manually clamped onto clamps of the disclosed apparatus. Furthermore, in order to plate essentially the entire surface of the work pieces, the clamps must be exposed to the electrolyte. The clamps accumulate electroplated metallic deposits. The metallic deposits must be removed periodically to assure proper continued operation of the apparatus. Such removal of undesired metallic deposits entails undesirable time and labor. Furthermore, the machine is mechanically complex with many moving parts. It can reasonably be expected to require significant time and labor to maintain the apparatus in proper working order.

The apparatus disclosed in U.S. Pat. No. 4,755,271 issued to Hosten is designed to electroplate plate-shaped work pieces, such as printed circuit boards, in horizontal position as they are conveyed through processing chambers. This type of apparatus exhibits several characteristics that make it undesirable. For example, one or more edges of the work piece are grasped by one or more tong-like clamps. The clamps, attached to a conveyor drive outside the zone in which the electrolyte freely washes over the work pieces, carry the work pieces horizontally through the electroplating chamber. The clamps are electrified to supply electrical current to the work piece. Whereas the design of the clamps and shielding seals is intended to minimize the quantity of electrodeposited metal on the clamps, some metallic deposition does occur. To remove the undesired metallic deposits, Hosten teaches using chemical and/or mechanical stripping of the deposits after each cycle of the clamps through the electroplating chamber. Additionally, the work pieces must be properly positioned on the conveyor for the clamps to properly engage the edge of the panel. Further, some means must be supplied for aligning the panels so the clamps engage the work pieces properly. Huston also teaches that it is often desirable to have two sets of clamps attached to two separate conveyors which operate parallel to the direction of travel of work pieces. The two sets of clamps operating in concert with each other support both edges of the work pieces that are parallel to the direction of travel. Use of a second set of clamps and associated conveyor supports the work pieces more securely, especially when the work pieces are thin and have little rigidity. While this desirable configuration with two parallel conveyors and associated clamps improves the support for the work pieces, it severely restricts the sizes of work pieces that may be processed. If the parallel conveyors are spaced at a fixed distance apart, only work pieces with at least one dimension equal to the fixed distance between the clamps will properly engage both sets of clamps. If the conveyors were arranged so the distance between them is adjustable, work pieces of varying widths could be accommodated. Whenever work pieces with different widths are to be processed, the machine has to be stopped while the adjustments are made. Furthermore, it would be impossible to continuously process a mixture of panels of differing widths. Additionally, because a sealing shield is used to prevent most of the electrolyte from contacting the clamps, a substantial area of the work pieces does not make continuous contact with the electrolyte. Those areas of the work pieces not in contact with electrolyte do not plate. It is therefore impossible to have plated through holes in those areas. This limits the capabilities of the plating apparatus and can result in wasted materials for the work pieces. Further, many of these parts of such devices are subject to wear and maladjustment. The labor and time required to maintain such a complex machine in proper operating condition can reasonably be expected to be quite high.

An apparatus for conveyorized plating of flat components, such as printed circuit boards is disclosed in U.S. Pat. No. 5,417,828 issued to Sergio. This apparatus processes work pieces through the plating cell while they are suspended vertically from a conveyor located above the plating zone. The conductive clamps that support the work pieces are electrified to provide electrical current to the work pieces. The vertical position of the work pieces, as they are transported through the electroplating zone, is not compatible with conventional horizontal processing equipment. In order for this apparatus to be used in conjunction with such horizontal conveyorized processing equipment, the work pieces must be removed from the horizontal equipment and manually clamped onto the conveyor of the disclosed apparatus. Such handling entails undesirable time and labor. Additionally in order to plate the entire surface of the work pieces, the conductive clamps are subject to contact with the electrolyte. The clamps will receive a metallic electrodeposit that will eventually interfere with operation of the clamps. Such metallic deposit must be periodically removed to assure continued operation of the apparatus. Furthermore, work pieces suspended from a vertical clamp tend to swing in an arc perpendicular to the direction of travel of the conveyor. If the swinging becomes excessive, the work pieces can strike the walls of the electrolytic cells. Should that occur, the conveyor could be jammed.

The apparatus disclosed in U.S. Pat. No. 5,658,441 issued to Spain et al is designed to electroplate flat work pieces with through holes, such as printed circuit boards, in a horizontal conveyorized spray plating machine. The electrified clips and/or pusher bars push the work piece through the plating zone. In order for the pusher bars to engage the trailing edge of the work pieces and thereby provide electrical contact with the work pieces, the work pieces must be properly spaced horizontally along the roller conveyor. Should the work pieces be spaced too close together, the pusher bars may attempt to engage the work pieces at a point other than the trailing edge. This will result in improper contact and possible jamming of the conveyor. Additionally, once the pusher bars are affixed to the electrically conductive conveyor, it is difficult or impossible to adjust the spacing between the pusher bars. Therefore, the spacing between pusher bars must be sufficient to accommodate work pieces with the greatest longitudinal dimension expected to be processed. For all work pieces with longitudinal dimension less than that of the largest work pieces, excessive spacing between the work pieces on the horizontal roller conveyor will occur. This will result in fewer work pieces being processable in any given time period. If the length of the work pieces is greater than the distance between the contactors, they can not be processed at all. If the longitudinal axis of the work pieces is not oriented parallel to the direction of travel, the contactors will not engage the work pieces properly. Furthermore, Spain teaches that the conductive pusher bars accumulate electroplated deposits as they pass through the plating zone. These accumulated deposits must be removed by chemical or electrochemical methods in order to assure proper engagement of the work pieces with the pusher bars. This requires undesirable extra operations and expenses.

Unlike prior art, the embodiments of this invention are mechanically quite simple. There are relatively few total parts and only a few moving parts. Most of the moving parts are subjected primarily to continuous rotation. This type of motion is much less stressful to parts than motions that involve repeated acceleration and deceleration, such as opening and closing of clamps. Roller conveyor mechanisms are extremely durable compared to most other means of transporting work pieces. Therefore, it can reasonably be expected that the time and labor required to maintain the embodiments of this invention will be less than more complex mechanisms.

A primary object of this invention is to electroplate the entire planar surfaces and through hole surfaces of discreet, randomly sized flat work pieces having through holes, such as printed circuit boards, while the work pieces are being transported by a conveyor through a plating bath.

Another object of the invention is to plate the work pieces as they are transferred from conventional conveyorized printed circuit manufacturing equipment without the necessity of unloading the work pieces from the conventional equipment and reloading into the plating apparatus.

Another object of this invention is to allow electrical connection of the work pieces to a power source without deposition of undesirable metallic deposits onto the electrical connecting device.

A still further object of this invention is to minimize the number of moving parts in the mechanism so as to minimize maintenance down time and cost.

A still further object of this invention is to permit the processing of work pieces randomly placed onto the conveyor to avoid the necessity of aligning the parts on the conveyor in order for the electrical contactor to properly engage the work pieces.

A still further object of this invention is to simultaneously electroplate two or more work pieces placed side by side on the roller conveyor.

A still further object of this invention is to be able to electroplate work pieces of differing thicknesses without adjustment of the plating apparatus or with work pieces with differing thicknesses randomly intermixed.

A still further object of the invention is to provide a cathode which more evenly distributes the current over the surface of the board.

Other objects of this invention will become apparent upon reading the detailed description hereinafter following.

SUMMARY OF THE INVENTION

This invention comprises a driven conveyor for transporting work pieces into one or more flood plating cells for electroplating a metal onto the planar surfaces and surfaces of the through holes of the work piece. An electrolyte solution is pumped by one or more recirculating pumps into the flood cell at such a rate as to maintain the liquid at a desired level covering the anodes and work pieces while work pieces are moved through the cells. One or more power sources provide direct current to the anodes and to the electrified contactors to transmit electrical current to the work pieces. The electrified contactors are positioned across the path of the work piece and spaced outside of the flood cell such that the electrolyte solution does not contact the contactors. Plating will occur so long as the work piece is in contact with one or more of the electrified contactors and the electrolyte.

Embodiments of this invention include both horizontal and vertical conveyors, horizontal and vertical flood plating cells, and horizontal and vertical electrified contactors. Because the most commonly used conveyorized equipment for processing flat work pieces, such as printed circuit boards, is horizontally oriented, most of the discussion will be directed toward horizontal conveyors, horizontal flood plating cells, and horizontal electrified contactors. Although little discussion is directed toward vertical processing equipment, such equipment is still one of the embodiments of this invention.

DETAILED DESCRIPTION OF INVENTION

Figure 1:
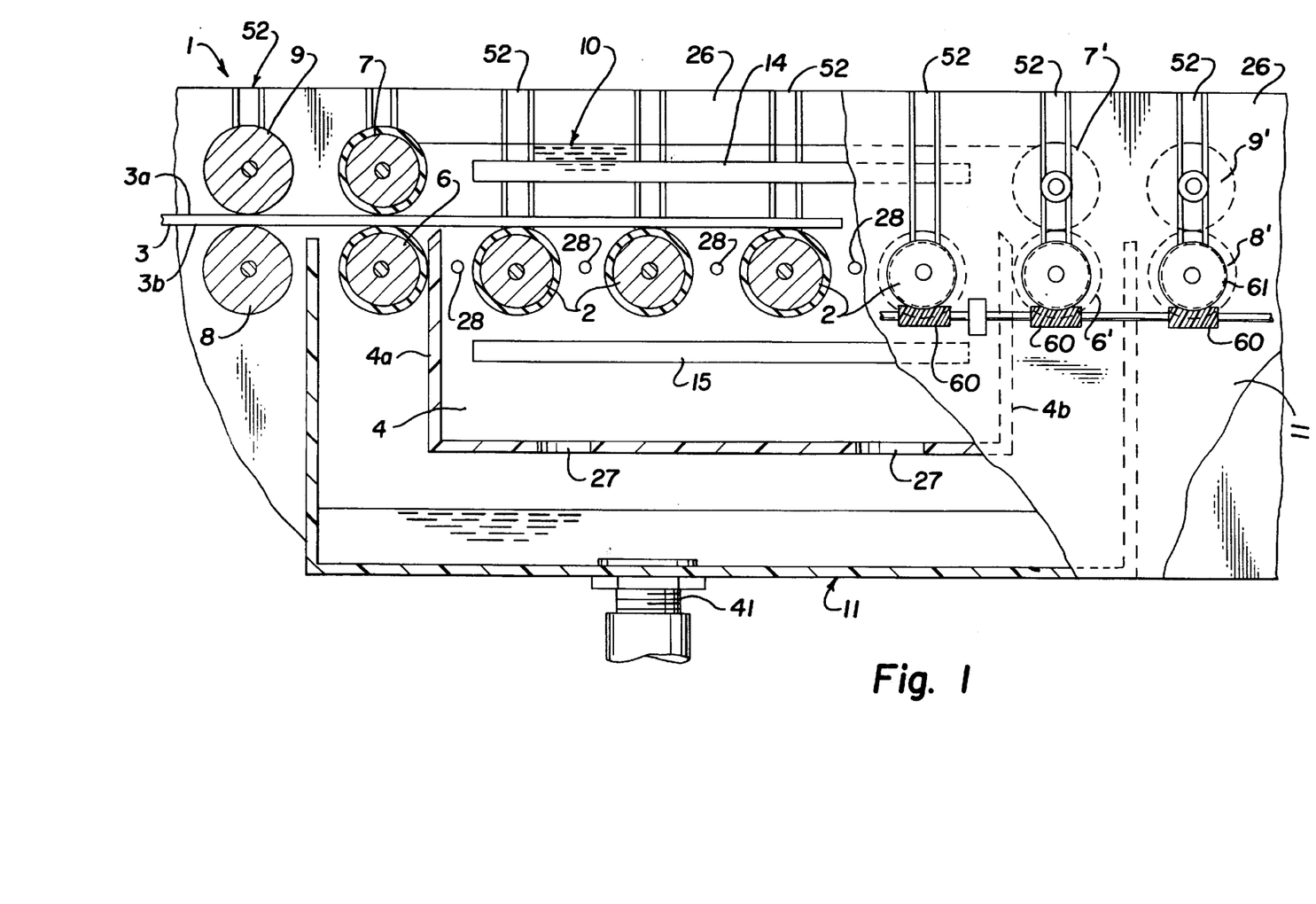
FIG. 1 is a longitudinal diagrammatic end view of the electroplating device with parts broken away to more clearly illustrate the invention.

As best illustrated in FIG. 1, conveyor means such as a horizontal, driven-roller conveyor 1 with rollers arranged transverse to the direction of travel of the work pieces 3 as shown by the arrow, transports a work piece 3 horizontally through a horizontal flood plating cell means 4. Driven conveyor rollers 2 carry the work piece 3. The work piece 3 is typically a discreet, flat panel having an upper surface 3a and lower surface 3b. Often the work piece 3 will have numerous holes 3c formed therein by punching or drilling. Driven pinch rollers 6 and 6' and idler pinch rollers 7 and 7' respectively are arranged with axes aligned transverse to the path of the work piece 3 and act together to form a dam at each end 4a and 4b of the flood plating cell 4 while still allowing the work pieces 3 to pass into and out of the flood plating cell 4. The idler pinch rollers 7 and 7' are supported by suitable means in a manner as to permit rolling contact with the driven pinch rollers 6 and 6' respectively and to permit them to move apart from rollers 6 and 6' to permit the work piece 3 to move there between. Electrified driven rollers 8 and 8' and electrified idler rollers 9 and 9' are arranged with axes aligned transverse to the path of the work piece 3 to contact the lower surface 3b and upper surface 3a , respectively, of the work piece 3. This contact makes the work piece 3 cathodic so long as the work piece 3 is in contact with one or more pairs electrified rollers 8 and 9 and/or 8' and 9'. The electrified driven rollers 8 and 8' are arranged contacting and with axes parallel to the axes of electrified idler rollers 9 and 9' respectively. The electrified idler rollers 9 and 9' are supported by suitable means in a manner as to permit rolling contact with the electrified driven rollers 8 and 8' respectively and to permit them to move apart from rollers 8 and 8' respectively to permit the work piece 3 to move there between. The work piece 3 enters the crease between the common surfaces of electrified rollers 8 and 9 and rollers 8' and 9' forcing rollers 9 and 9' apart to permit the work piece 3 to move between and along the rollers 8 and 9 and rollers 8' and 9'.

Figure 3:
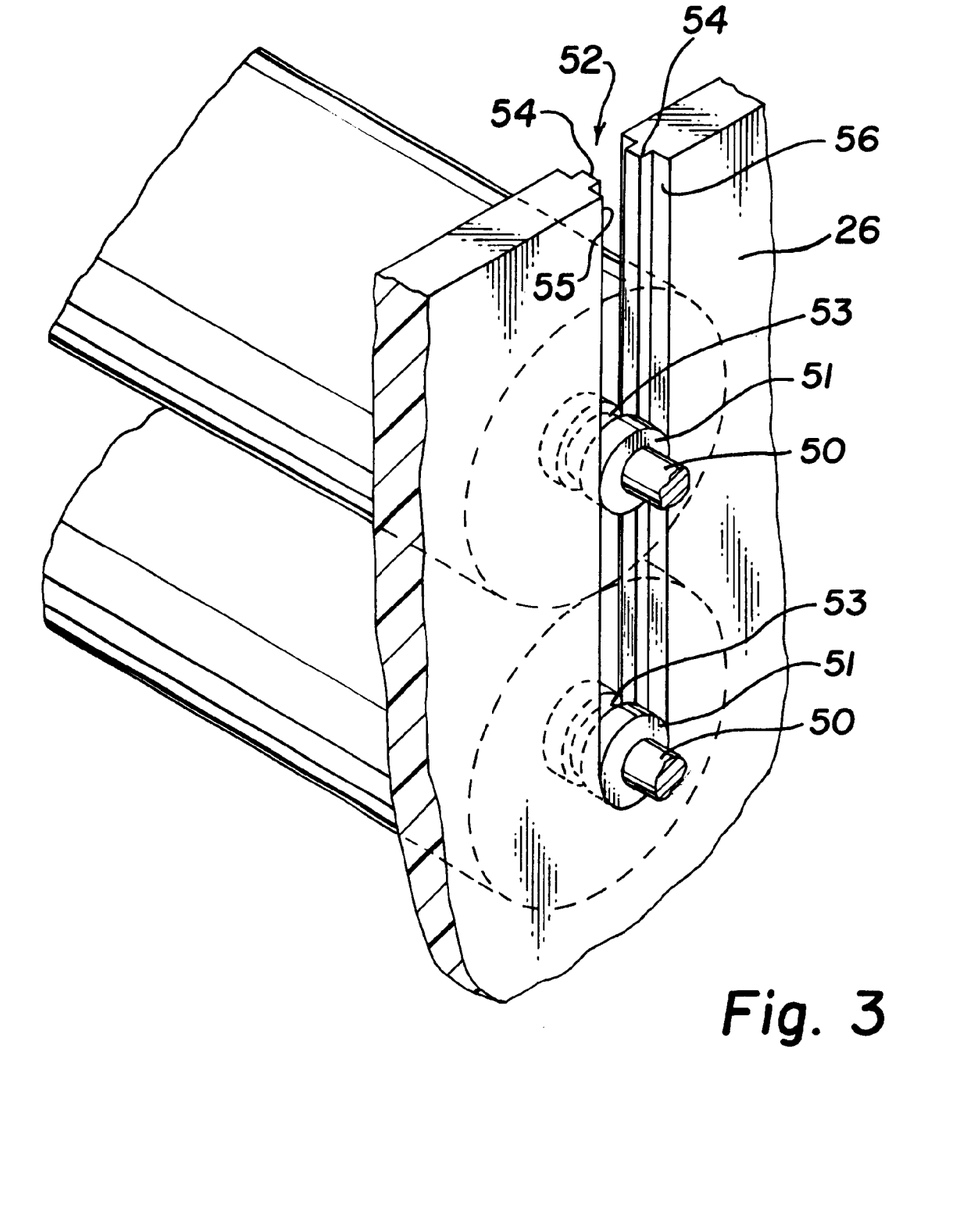
FIG. 3 is a perspective view of the support for the rollers.

One means of supporting the idler pinch rollers 7 and 7' and the electrified idler rollers 9 and 9' comprises end shafts 50 formed on each end of the rollers which are supported by bushings 51 which slides in slots 52 formed in sidewalls 26. The slots 52 may have tongues 54 on one or both sides 55 and 56 to receive and hold the bushings 51. The bushings 51 have grooves 53 formed in the circumference thereof to match the tongues 54 in the slots 52 of the sidewalls 26. Thus the idler rollers 7, 7', 9 and 9' may move within the confines of the slots 52. Suitable drive means such as worm gears 60 arranged on driven shaft 62 drive gears 61 to drive rollers 2, 6, 6', 8 and 8'.

A metal ion containing electrolyte solution 10 is pumped, by suitable means as will more fully described hereinafter, into the flood plating cell 4 from a tank or sump 11 as diagrammatically illustrated in FIG. 4 by means of a pump 12. The sump 11 forms a containment chamber below the flood plating cell 4 to capture the electrolyte 10 and route same to the suction side of the pump 12. The pumping rate is controlled by any suitable means such as a valve 13 so that the upper anode 14 and lower anode 15 are immersed in the electrolyte 10 at all times while work pieces 3 are being electroplated.

This invention is compatible with conventional conveyorized printed circuit processing equipment such as that manufactured by Chemcut Division of Atotech, Inc.; Coates ASI; Schmid; International Systems and others widely known in the industry. The horizontal roller conveyor of the horizontal embodiment of this invention is essentially similar to the horizontal roller conveyors used in conventional horizontal printed circuit processing equipment. Although not shown, a vertical embodiment of this invention is possible, having vertical roller conveyors which are essentially similar to and compatible with the vertical conveyors of conventional vertical printed circuit processing equipment. Therefore, the apparatus disclosed therein, is able to continuously receive work pieces 3 from conventional processing equipment without unloading them from the conveyor of conventional equipment and reloading them onto the conveyor of this invention.

The idler pinch rollers 7 and 7' are arranged contacting and with axes parallel to the axes of driven pinch rollers 6 and 6' respectively. The plane defined by the axes of rollers 6 and 7 and the plane defined by the axes of rollers 6' and 7' are perpendicular to the plane of the conveyor. Suitable support means, as will be disclosed more filly hereinafter, is provided for the pinch rollers to contain the electrolyte 10 in the flood plating cell 4. Suitable sidewalls 26 form the remainder of the flood cell 4. Suitable support means, more fully disclosed hereinafter, support the outer ends of the pinch rollers 6 and 6' and 7 and 7'. Thus, as work piece 3 enters the seal between rollers 6 and 7 and 6' and 7', the idler pinch rollers 7 and 7' are urged apart such that the work piece 3 moves forward yet the surfaces of the pinch rollers 6 and 6' and 7 and 7' remain in contact with surfaces 3b and 3a of the work piece 3 respectively. The pinch rollers 6 and 6' and 7 and 7' with the roller support means or sidewalls 26 form the containment means to maintain the electrolyte 10 at a suitable level to submerse the upper anode 14, work piece 3 and lower anode 15 in the electrolyte 10 as the work piece 3 moves through the flood cell 4. Other suitable means of controlling the level of electrolyte 10 in the flood plating cell 4 may be used, so long as both lower anode 15 and upper anode 14 and work piece 3 remain immersed in electrolyte 10 while work pieces 3 are being electroplated. Should another suitable means be used to control the level of the electrolyte 10 in the flood plating cell 4, the pinch rollers 6 and 6' and 7 and 7' could be eliminated. In addition to controlling the level of electrolyte 10 in the flood plating cell 4, the rollers 6 and 6' and 7 and 7' prevent electrolyte 10 from flowing along the surface of the work piece 3 and contacting the electrified rollers 8 and 8' and 9 and 9'.

Excess pumped electrolyte 10 flows out of the flood plating cell 4 over the flood cell sidewalls 26 and/or through optional flood cell drains 27. Valves 40 on the sump drain 41 are optional to control the rate at which electrolyte 10 drains from the sump 11 though pipe 42 into pump 12. Preferably, the flow of excess electrolyte 10 out of the flood plating cell 4 is directed perpendicular to the direction of travel of the work pieces 3, away from the electrified rollers 8 and 8' and 9 and 9'. In this manner, the electrolyte 10 avoids contact with the electrified rollers 8 and 8' and 9 and 9'. The electrified rollers 8 and 8' and 9 and 9' are positioned transverse to the direction of travel of the work pieces 3 just far enough outside the flood plating cell 4 to avoid contact with electrolyte 10 that may escape when the pinch rollers 6 and 6' and 7 and 7' open to admit work pieces 3. So long as contact between the electrolyte 10 and the electrified rollers 8 and 8' and 9 and 9' is avoided, no undesired metallic deposits will be electroplated onto the electrified rollers 8 and 8' and 9 and 9'. The electrolyte 10 is pumped into flood cell 4 though ports 28 from pipes 29 which connect to the pressure side of pump 12.

Other means of contacting the work pieces 3 with electrified contactors may be used. These include, but are not limited to, electrified metallic bristled brushes, electrified carbon brushes, electrified rods, electrified glides, or electrified shoes on which work pieces slide as they are driven forward by the roller conveyor 1. Electrified rollers 8 and 8' and 9 and 9' are the preferred embodiment of this invention because they make electrical contact with the work piece 3 and help drive the work piece 3 forward.

Figure 5:
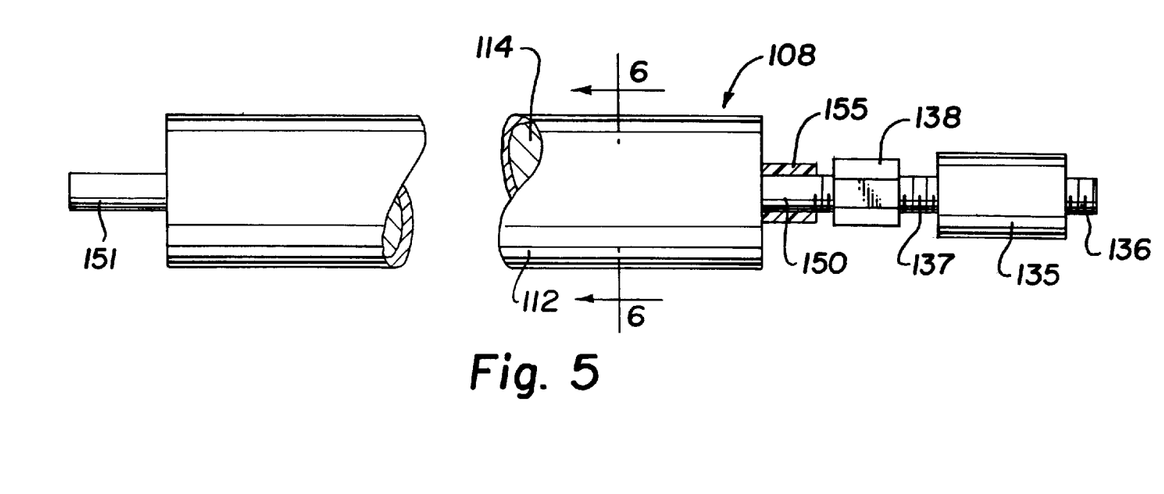
FIG. 5 is an elevational view of the cathode roller with parts broken away.
Figure 6:
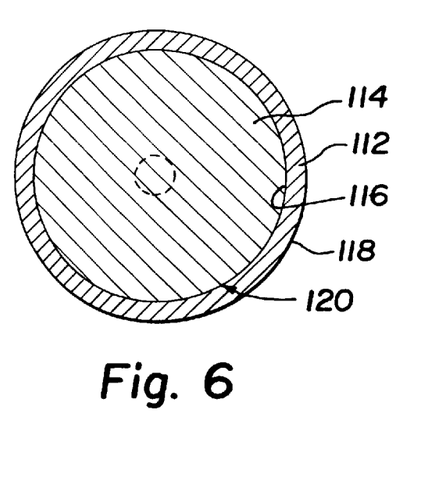
FIG. 6 is a cross-sectional drawing of the cathode taken along line 6—6 of FIG. 5.

A preferred embodiment of the electrified rollers 8, 8', 9 and 9' is illustrated in FIGS. 5 and 6 of the drawings. Only one roller is shown but all would be constructed in a similar manner. While materials such as stainless steel and titanium are conductive, the electrical and thermal conductivity of these metal is low. In order to overcome, the low conductivity of these metals which resist the corrosive elements of the electrolyte but increase the conductivity the following embodiment of the roller has been developed. Electrified roller 108 has an outer tubular shell 112 formed of a suitable electrically conductive material such as stainless steel or titanium which is compatible or inert to the corrosive elements in the electrolyte 10. Typical current conducting materials such as copper are corroded by the acids in the electrolyte material and are more easily plated on. An inner core 114 formed of copper or other more highly conductive material is positioned in the outer tubular shell 112 such that the outer surface 120 of inner core 114 is in tight contact with the inner surface 116 of outer tubular shell 112. This may be accomplished by forcing a slightly oversized inner core 114 into the tube or by heating outer shell 112 then allowing it to contract around the inner core 114. The outer surface 118 of the outer tubular shell 112 is smooth and straight to contact the work piece 3 as it moves on the conveyor 1. It is preferred that the wall thickness of the outer tubular shell 112 be kept to a minimum to maximize the transmission of electric current to the work piece 3. By using a copper inner core 114 the current is more evenly distributed over the length of the electrified roller 108 and thereby across the width of the work piece 3. Shafts 150 and 151 are suitable attached the opposite ends of electrified roller 108 such that the longitudinal axis of the roller and shafts are aligned to form the rolling surfaces for the which are supported by bushings 51 as heretofore described. Shaft 150 is formed of copper of other conductive material and coated with a suitable protective cover 155 formed from a suitable material to protect the shaft 150 from the corrosive elements of the electrolyte 10. The shaft 151 is preferable formed of stainless or other suitable material which is compatible with the electrolyte 10.

A suitable commutator 135 is attached by a suitable coupling nut 138 threaded on to shaft 150 and threaded shaft 137 of the commutator 135. A second shaft 136 is attached to the electrical source by suitable wires (not shown). Although numerous such commutators are available one such device is one manufactured by Mercotac, Inc. of Carlsbad, California.

The spacing of the electrified contactors 8, 8', 9 and 9' is critical. They must be far enough outside the flood plating cell 4 to avoid contact with the electrolyte 10. Additionally, they must be spaced properly relative to both the location of the flood plating cell 4 and length of the work pieces 3. In order to complete an electrical circuit, work pieces 3 must be in contact with the electrical contactor or the electrified rollers 8 and 8' and 9 and 9'. No plating will occur when the work pieces 3 are not in electrical contact with one or more contactors. In order to maximize the length of time the work pieces 3 in the flood plating cell 4 are electrically connected, electrified rollers 8 and 9 and 8' and 9' should be positioned slightly less than the length of one work piece 3 apart. For example, if work pieces 18 inches long are to be plated, the electrified rollers 8 and 9 and 8' and 9' should be spaced a little less than 18 inches apart. With this spacing, each work piece 3 will be in constant contact with one or more electrified rollers 8 and 9 or 8' and 9' the entire time it is in the flood plating cell 4.

Although it is preferable that the work pieces 3 be in constant contact with one or more electrified rollers 8 and 8' and 9 and 9' while in the flood plating cell 4, this is not necessary in order to plate successfully. So long as a work piece 3 is in contact with one or more pairs of electrified rollers 8 and 9 or 8' and 9' for part of the time it is in the flood plating cell 4, it will plate at least part of the time. Work pieces 3 with lengths greater than the sum of the distance between the electrified rollers 8 and 9 and flood plating cell 4, plus the distance between the rollers 8' and 9' and the flood plating cell 4 can be plated completely. Work pieces 3 with length less than the sum of the distances between the electrified rollers 8 and 9 and the flooded plating cell 4, plus the distance between rollers 8' and 9' and the flood plating cell 4 will not plate completely. Whenever a work piece 3 is out of electrical contact with both pairs of electrified rollers 8 and 9 or 8' and 9', no metallic deposit will be electroplated onto the planar surfaces 3a and 3b of the work piece 3 or the through holes 3c. However, as soon as contact with one or more pairs of the electrified rollers 8 and 9 or 8' and 9' is re-established, electroplating will start again. This feature of this invention allows work pieces 3 of many different lengths to be plated without adjustment of the distances between the electrified rollers 8 and 9 and 8' and 9' and the flood plating cell 4. However, efficiency of the flood plating cell 4 is reduced when the work piece 3 is out of contact with one or more pairs of electrified rollers 8 and 9 or 8' and 9'. Therefore, it is desirable to position electrified rollers 8 and 9 and 8' and 9' so one or more pairs is in contact with the work piece 3 during the entire time it is in the flood plating cell 4.

Continuing with the example of work pieces 18 inches in length, electrified rollers 8 and 9 and 8' and 9' are spaced a little less than 18 inches apart. Approximately 2 inch spacing between the flood plating cell 4 and each pair of the electrified rollers 8 and 9 and 8' and 9' is desirable. This will prevent electrolyte 10 from contacting the electrified rollers 8 and 9 and 8' and 9' when the pinch rollers 6 and 6' and 7 and 7' open to admit a work piece 3 into the flood plating cell 4. With electrical contactor or electrified rollers 8 and 8' and 9 and 9' and flood plating cell 4 arrangements such as this, the flood plating cell 4 will typically be about 14 inches long. Work pieces 3 with lengths greater than 4 inches can be plated completely with this configuration of electrified rollers 8 and 9 and 8' and 9' and flood plating cell 4.

It may be desirable to electroplate longer than the time the work piece 3 is in a single flood plating cell 4. In such cases, the total plating time can be increased simply by adding more flood plating cells 4 and attendant electrified rollers 8 and 8' and 9 and 9'. The plating time can be increased almost without limit by adding more flood plating cells and attendant electrified rollers.

Anodes 14 and 15 used in the flood plating cell 4 may be of inert, electrically conductive material that is insoluble in the electrolyte 10. Alternatively, the anodes 14 and 15 may be of sacrificial metal that dissolves in the electrolyte 10 and may be contained in an inert, electrically conductive basket as well known in the industry. If inert anodes are used, metal ions to be converted to elemental metal and deposited onto the surfaces of the work pieces 3 are supplied by the electrolyte 10. Periodic replenishment of desired metal ions is required to replace the metal ions converted to elemental metal. If sacrificial anodes of the same metal as that being electrodeposited are used, the metal ions in the electrolyte will be replaced as the anodes 14 and 15 dissolve. In such cases, it is not usually necessary to add metal ions to replenish the electrolyte 10.

Figure 4:
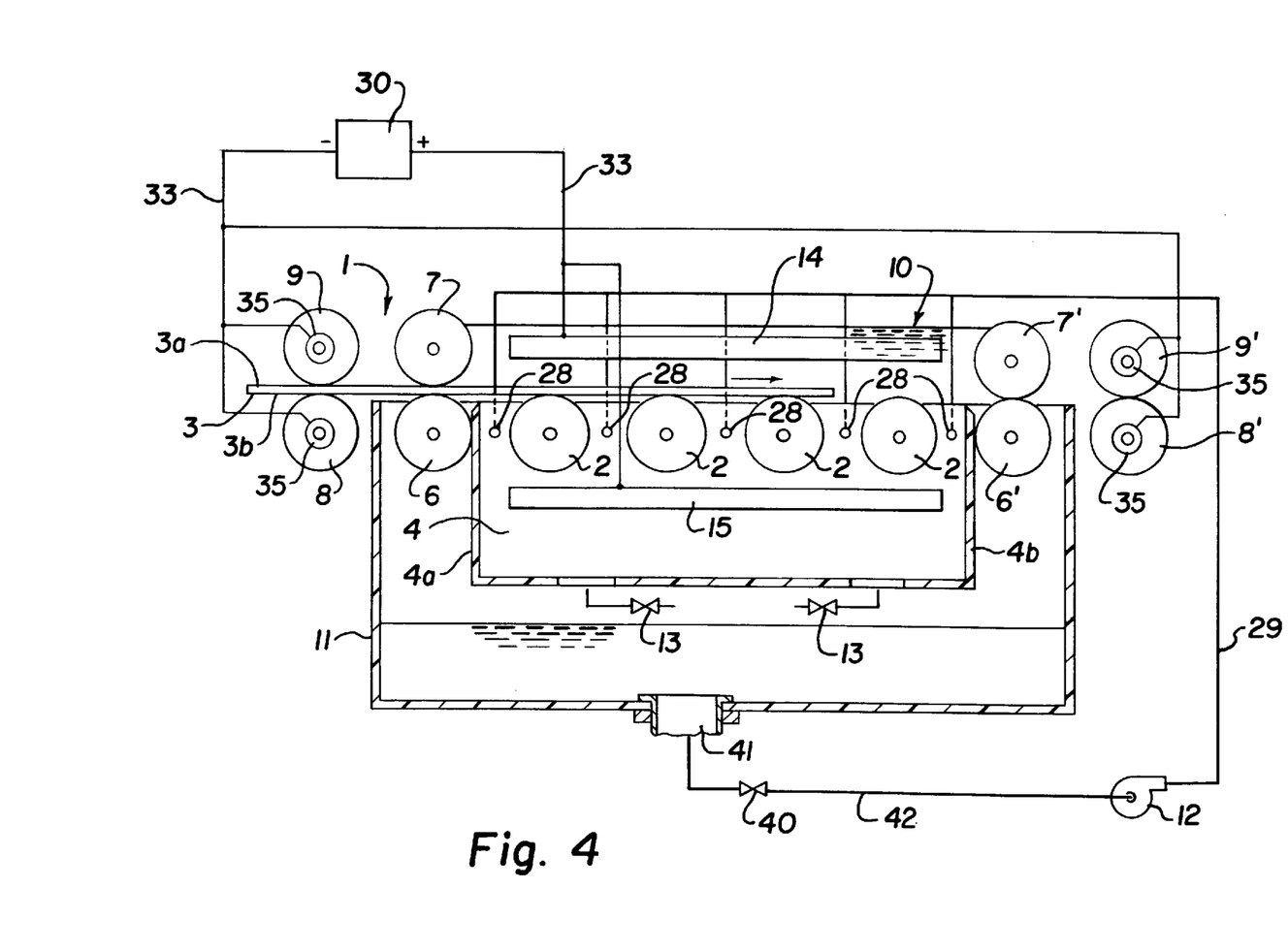
FIG. 4 is a schematic view of the pump and electrical connections.

Anodes 14 and 15 are supplied with direct electric current by power means such as one or more generators, rectifiers, or other suitable sources of direct electrical current 30 diagramatically illustrated in FIG. 4. The current is transmitted from the source to the anodes 14 and 15 by suitable power transmission means 32 such as cables, wires, bus bars, or other appropriate means. Typically, all anodes 14 and 15 are connected electrically in parallel so that the electrical potential is essentially equal between any one of the anodes 14 and 15 and the work pieces 3. If it is desirable to provide more current to one side of the work piece 3 than to the other, multiple sources of current and multiple transmission means may be used. Cathode contactors means, such as the electrified rollers 8 and 9 and 8' and 9', are typically supplied with electrical current by the same direct current power source 30 as the anodes 14 and 15. However, the pole opposite that connected to the anodes 14 and 15 is connected to the electrified rollers 8 and 9 and 8' and 9'. The current from the source 30 is transmitted to the electrified rollers 8 and 9 and 8' and 9' using suitable power transmission means 32, such as cables, wires, bus bars, or other appropriate means similar to those used for anode connections. Electrified rollers 8 and 9 and 8' and 9' are typically connected electrically in parallel. If it is desirable to provide different amounts of current to different electrified rollers 8 and 9 and 8' and 9', this can be accomplished by using multiple power sources and multiple current transmission means. The connector means to introduce electrical current into the electrified rollers 8 and 9 and 8' and 9' may be of any convenient type adequate to accommodate the desired current. When using electrified rollers 8 and 9 and 8' and 9', as in the preferred embodiment of this invention, it is necessary to supply electrical current to the rotating rollers without interfering with their rotation. Commercially available commutators 35 with electrically conductive brushes or liquid metal in contact with the rotating shaft of electrified rollers 8 and 9 and 8' and 9' are satisfactory for this purpose. Even a device as simple as electrically conductive wire or cable wrapped around the rotating shaft of the electrified rollers 8 and 9 and 8' and 9' has proven to be successful for supplying current without interfering with the rotation of electrified rollers 8 and 9 and 8' and 9'.

The distance between the anodes 14 and 15 and the work piece 3 in this invention is different than the distances typical of ordinary tank plating operations or brush plating operations. In typical tank plating, the cathodic work pieces are placed about 4 to 12 inches from the anodes. In brush plating the cathodic work piece is usually only about ⅛ to ¹⁄₁₆ inches or less from the anode. In brush plating the anode and cathodic work piece are normally separated by only a porous fabric wet with electrolyte. In this invention the anodes 14 and 15 are typically spaced about 1 to 3 inches from the cathodic work pieces 3. Greater distances between the anodes 14 and 15 causes difficulty in keeping the upper anode immersed in electrolyte 10. Lesser distances can cause burned, non-uniform electroplated deposits.

Figure 2:
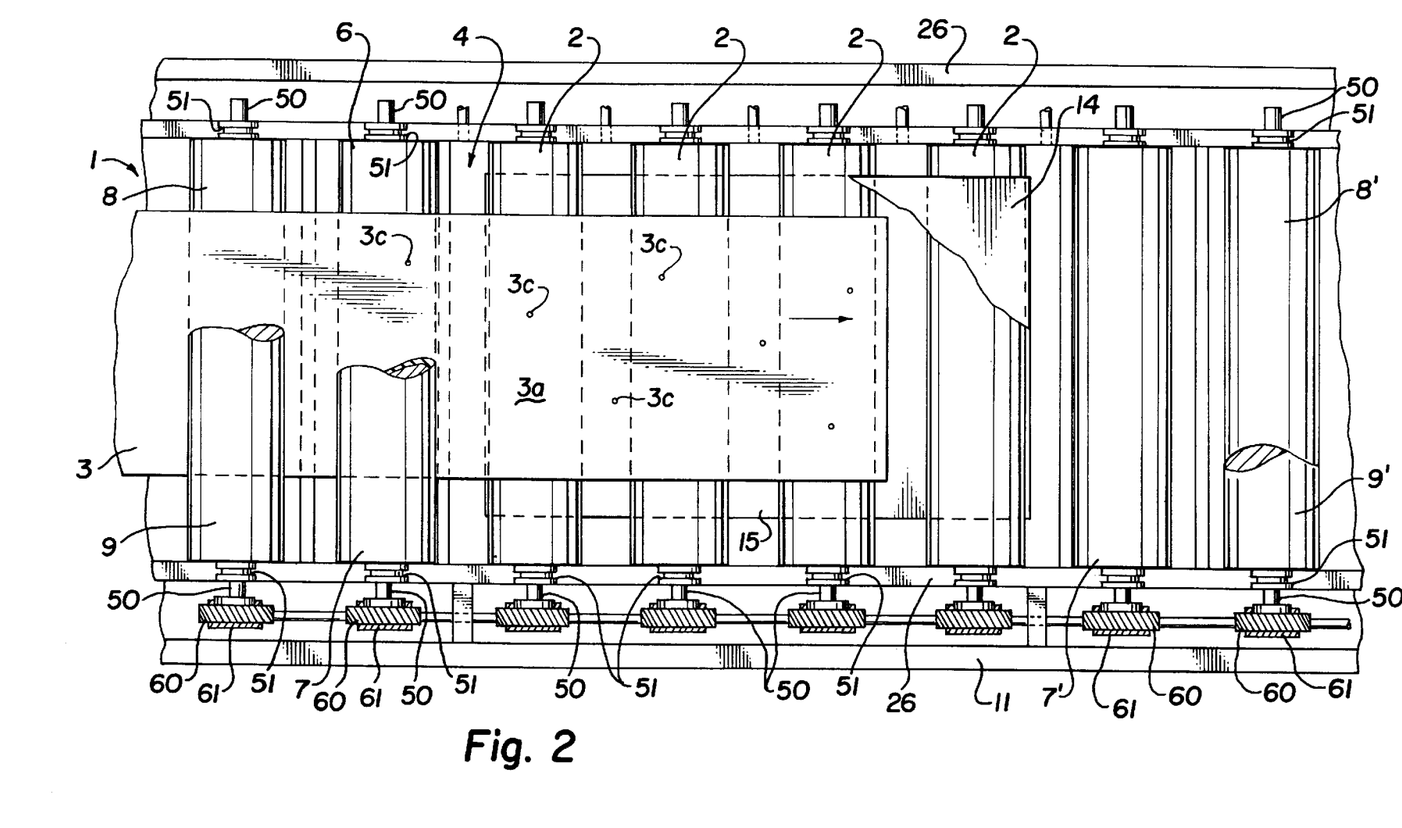
FIG. 2 is a plan view thereof.

The electrified rollers 8 and 9 and 8' and 9' are transverse to the direction of travel of the work pieces 3 and the electrified rollers 8 and 9 and 8' and 9' extend essentially the full width of the roller conveyor 1. This configuration provides several unique advantages over prior art. Unlike prior art, in the horizontal embodiment of this invention, electrical contact can be established with work pieces 3 in virtually any orientation in the plane of the roller conveyor 1.

Some prior art required work pieces to be carefully aligned along one side of conveyor with the longitudinal axis of the parts parallel to the direction of travel. If not properly oriented, the work pieces fail to properly engage with the electrical contactor. The electrical contactors or electrified rollers 8 and 9 and 8' and 9' in this invention will successfully engage work pieces 3 randomly spaced from one side of the conveyor to the other. Additionally, the electrified rollers 8 and 9 and 8' and 9' will accommodate work pieces 3 with their longitudinal axis aligned in directions other than parallel to the direction of travel.

Prior art devices that require work pieces to be aligned along one side of the conveyor are incapable of processing two or more work pieces placed side by side on the conveyor. Those work pieces not aligned on the contactor side of the conveyor fail to make electrical connection with the electrical contactor. Those work pieces not in electrical contact will not electroplate. The horizontal conveyor embodiment of this invention is capable of processing two or more work pieces 3 placed side by side on the conveyor means 1. The electrified rollers 8 and 9 and 8' and 9' extend transversely essentially the entire width of the conveyor means 1, so simultaneous electrical contact with more than one work piece 3 is possible. This is an especially useful capability when the work pieces 3 are narrow enough to place two or more side by side on the conveyor means 1. Placing work pieces 3 side by side dramatically increases the production capacity.

With respect to the thickness of work pieces 3 that may be processed, the electrified rollers 8 and 9 and 8' and 9' and the pinch rollers 6 and 7 and 6' and 7' function essentially the same as those used in conventional conveyorized processing equipment. Any thickness work piece that is compatible with the roller conveyor of conventional equipment is also compatible with this invention. Since roller conveyors of conventional equipment accommodate work pieces 3 of differing thicknesses randomly intermixed; the conveyor of this invention will likewise accommodate such intermixtures.

We claim:

1. A plating apparatus for moving a flat work piece with planar surfaces and through holes through an electrolyte solution to electroplate a metal onto the planar surfaces and the surfaces of the through holes of the work piece said work piece having a width which is transverse to the direction of travel of the work piece and a length parallel to the direction of travel of the work piece comprising: conveyor means adapted to cany the work piece through the electrolyte solution; flood cell means for containing the electrolyte solution and having ends located transverse to and in the path of the work piece such that the entire width of the planar surface of the work piece is immersed in the electrolyte solution; anode means adapted to be positioned on each side of the work piece in the flood cell means such that the electrolyte solution covers the anode means and work piece; distribution means to distribute the electrolyte solution onto the planar surfaces and through the through holes of the work piece as the same moves through the flood cell means; an electrified roller oriented transverse to the path of the work piece and located outside the flood cell means and electrolyte solution sufficiently spaced from the flood cell means to prohibit the electrolyte solution from contacting same and adapted to provide rolling contact with the work piece as same moves adjacent thereto, said electrified roller having an outer conductive surface compatible with the electrolyte solution and an inner core which is composed of an electrically conductive material; and power means adapted to provide direct current to the inner core of the electrified roller and anode means.

2. A combination called for in claim 1 wherein the outer conductive surface is composed of one or more of the following: stainless steel or titanium.

3. A combination called for in claim 1 wherein the inner core is composed of copper.

* * * * *